United States Patent [19]

Inada et al.

[11] Patent Number: 5,416,072

[45] Date of Patent: * May 16, 1995

[54] SUPERCONDUCTING DEVICE HAVING AN THIN SUPERCONDUCTING CHANNEL FORMED OF OXIDE SUPERCONDUCTING MATERIAL

[75] Inventors: Hiroshi Inada; Takao Nakamura; Michitomo Iiyama, all of Osaka, Japan

[73] Assignee: Sumitomo Electric Industries, Ltd., Japan

[*] Notice: The portion of the term of this patent subsequent to Aug. 17, 2010 has been disclaimed.

[21] Appl. No.: 97,613

[22] Filed: Jul. 26, 1993

Related U.S. Application Data

[63] Continuation of Ser. No. 797,740, Nov. 1, 1991, abandoned.

[30] Foreign Application Priority Data

Nov. 1, 1990 [JP] Japan .................. 2-295659
Nov. 1, 1990 [JP] Japan .................. 2-295660

[51] Int. Cl.⁶ .............. H01B 12/00; H01L 39/22; B05D 5/12
[52] U.S. Cl. .............. 505/193; 257/39; 257/33; 257/35; 505/234; 505/238; 505/702; 505/729; 427/62
[58] Field of Search .............. 505/1, 700–702, 505/192, 193, 234, 338, 729; 357/5; 427/62, 63; 257/39, 33, 35

[56] References Cited

U.S. PATENT DOCUMENTS

| | | | |
|---|---|---|---|
| 5,096,882 | 3/1992 | Kato et al. | 505/1 |
| 5,143,894 | 9/1992 | Rothschild et al. | 505/1 |
| 5,219,834 | 6/1993 | Usuki et al. | 505/1 |

FOREIGN PATENT DOCUMENTS

| | | | |
|---|---|---|---|
| 0324044 | 7/1989 | European Pat. Off. | 357/5 |
| 354804 | 2/1990 | European Pat. Off. | |
| 1170080 | 7/1989 | Japan | 257/39 |

OTHER PUBLICATIONS

Yoshida et al, "Monolithic Device Fabrication Using High-TC Superconductor", IEDM-88, Dec. 1988, pp. 282–285.
Wu et al, "High Critical Currents in Epitaxial YBaCuO Thin Films on Silicon", Appl. Phys. Lett., vol. 54, #8, 20 Feb. 1989, pp. 754–756.

*Primary Examiner*—Rolf Hille
*Assistant Examiner*—Mahshid Saadat
*Attorney, Agent, or Firm*—Beveridge, DeGrandi, Weilacher & Young

[57] ABSTRACT

A superconducting device has a superconducting channel formed of an oxide superconductor on the principal surface of a substrate. A source electrode and a drain electrode likewise formed of oxide superconductor, are electrically connected by the channel to provide for superconducting current flow. A superconducting gate electrode is isolated by a side insulating region which completely covers each of opposite side surfaces of the gate electrode. The relative thicknesses of both the source and drain electrodes are much greater than that of the channel thickness. The superconducting channel and the gate insulator are both formed by one oxide thin film, and in a preferred embodiment, the gate electrode likewise is provided by the same film which forms the gate insulator and channel. The gate insulator is therefore is formed of the same constituent elements as those of the superconducting channel, but the film portion which forms the gate insulator has oxygen in an amount less than that of the portion defining the channel. The superconducting gate electrode is surrounded by the superconducting channel, the superconducting source electrode and the superconducting drain electrode but is electrically isolated from the superconducting channel, the superconducting source electrode and the superconducting drain electrode by the gate insulator and the side insulating region.

14 Claims, 6 Drawing Sheets

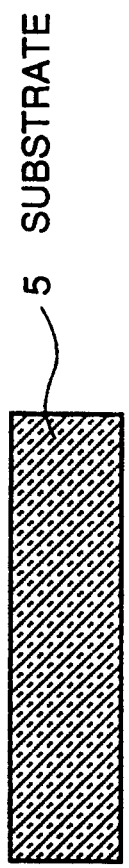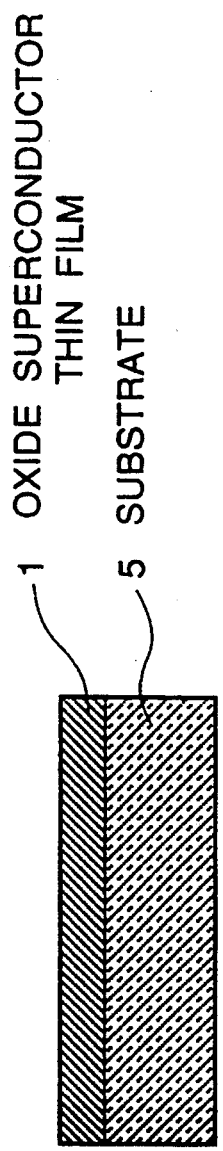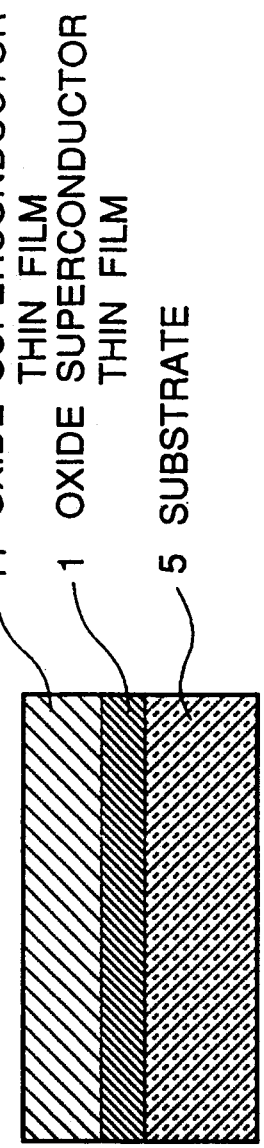
FIGURE 2A
FIGURE 2B
FIGURE 2C

SUPERCONDUCTING DEVICE HAVING AN THIN SUPERCONDUCTING CHANNEL FORMED OF OXIDE SUPERCONDUCTING MATERIAL

This application is a continuation of application Ser. No. 07/797,740, filed Nov. 1, 1991, now abandoned, which application is entirely incorporated herein by reference.

BACKGROUND OF THE INVENTION

1. Field of the Invention

The present invention relates to a superconducting device and a method for manufacturing the same, and more specifically to a superconducting device having a substantially planar upper surface and including superconducting channel formed of oxide superconductor material, which channel, in the direction perpendicular to the substrate for the device, is relatively thin as compared to the thicknesses of the device's source and drain electrodes in that perpendicular direction.

2. Description of Related Art

Typical three-terminal devices which utilize a superconductor include a so called superconducting-base transistor and a so called super-FET (field effect transistor). The superconducting-base transistor includes an emitter of a superconductor or a normal conductor, a tunnel barrier of an insulator, a base of a superconductor, a semiconductor isolator and a collector of a normal conductor, stacked in the named order. This superconducting-base transistor operates at a high speed with a low power consumption, by utilizing high speed electrons passing through the tunnel barrier.

The super-FET includes a semiconductor layer, and a superconductor source electrode and a superconductor drain electrode which are formed closely to each other on the semiconductor layer. A portion of the semiconductor layer between the superconductor source electrode and the superconductor drain electrode has a greatly recessed or undercut rear surface so as to have a reduced thickness. In addition, a gate electrode is formed through a gate insulator layer on the recessed or undercut rear surface of the portion of the semiconductor layer between the superconductor source electrode and the superconductor drain electrode.

A superconducting current flows through the semiconductor layer portion between the superconductor source electrode and the superconductor drain electrode due to a superconducting proximity effect, and is controlled by an applied gate voltage. This super-FET also operates at a high speed with a low power consumption.

In addition, in the prior art, there has been proposed a three-terminal superconducting device having a channel of a superconductor formed between a source electrode and a drain electrode, so that a current flowing through the superconducting channel is controlled by a voltage applied to a gate formed above the superconducting channel.

Both of the above mentioned superconducting-base transistor and the super-FET have a portion in which a semiconductor layer and a superconducting layer are stacked to each other. However, it is difficult to form a stacked structure of the semiconductor layer and the superconducting layer formed of an oxide superconductor which has been recently advanced in study. In addition, even if it is possible to form a stacked structure of the semiconductor layer and the oxide superconducting layer, it is difficult to control a boundary between the semiconductor layer and the oxide superconducting layer. Therefore, a satisfactory operation could not been obtained in these superconducting devices.

In addition, since the super-FET utilizes the superconducting proximity effect, the superconductor source electrode and the superconductor drain electrode have to be located close to each other at a distance which is a few times the coherence length of the superconductor materials of the superconductor source electrode and the superconductor drain electrode. In particular, since an oxide superconductor has a short coherence length, if the superconductor source electrode and the superconductor drain electrode are formed of the oxide superconductor material, a distance between the superconductor source electrode and the superconductor drain electrode has to be not greater than a few ten nanometers. However, it is very difficult to conduct a fine processing such as a fine pattern etching so as to ensure the very short separation distance. Because of this, in the prior art, it has been impossible to manufacture the super-FET composed of the oxide superconductor material.

Furthermore, it has been confirmed that the conventional three-terminal superconducting device having the superconducting channel shows a modulation operation. However, the conventional three-terminal superconducting device having the superconducting channel could not realize a complete ON/OFF operation, because a carrier density is too high. In this connection, since an oxide superconductor material has a low carrier density, it is expected to form a three-terminal superconducting device which has a superconducting channel and which can realize the complete ON/OFF operation, by forming the superconducting channel of the oxide superconductor material. In this case, however, a thickness of the superconducting channel has to be made on the order of 5 nanometers.

SUMMARY OF THE INVENTION

Accordingly, it is an object of the present invention to provide an FET type superconducting device having a planar upper surface and including a superconducting region constituted of an extremely thin oxide superconductor film, which have overcome the above mentioned defects of the conventional ones.

Another object of the present invention is to provide a method for manufacturing an FET type superconducting device which have overcome the above mentioned defects of the conventional ones.

The above and other objects of the present invention are achieved in accordance with the present invention by a superconducting device comprising a substrate, superconducting channel formed of an oxide superconductor on the principal surface of said substrate, a superconducting source electrode and a superconducting drain electrode, which are relatively thick as compared to the thickness of the channel, and are formed of the oxide superconductor on said superconducting channel separated from each other but electrically connected by said superconducting channel, so that a superconducting current can flow through said superconducting channel between the superconducting source electrode and the superconducting drain electrode, a superconducting gate electrode formed of the oxide superconductor through a gate insulator on said superconducting channel for controlling the superconducting current flowing through said superconducting channel, and a side insulating region formed to completely cover each of opposite side surfaces of the superconducting gate electrode, the superconducting channel and the gate insulator being formed of the same oxide thin film of which oxygen amount is locally decreased and said gate insulator being formed of a compound oxide which is composed of the same constituent elements as those of the oxide superconductor of which the superconducting channel is formed but includes the oxygen amount less than that of said oxide superconductor, and the superconducting gate electrode being surrounded by the superconducting channel, the superconducting source electrode and the superconducting drain electrode but electrically isolated from the superconducting channel, the superconducting source electrode and the superconducting drain electrode by the gate insulator and the side insulating region.

According to another aspect of the present invention, there is provided a method of manufacturing a superconducting device, comprising the steps of forming on a surface of a substrate a first oxide superconductor thin film, forming a superconducting gate electrode of the oxide superconductor on a portion of said oxide superconductor thin film, etching portions of said oxide superconductor thin film at the both sides of the superconducting gate electrode using the superconducting gate electrode as a mask, so that a superconducting channel of an extremely thin oxide superconductor thin film is formed under the superconducting gate electrode and a step portion is formed on an upper surface of the superconducting channel and under the superconducting gate electrode, heating the substrate under high vacuum so that oxygen of the oxide superconductor of the step portion escapes and the oxide superconductor of the step portion is converted into an oxide insulating material and the step portion changes to a gate insulator, and growing a second oxide superconductor thin film on the exposed surface of the superconducting channel, using the gate electrode as a mask, so that a superconducting source electrode and a superconducting drain electrode having a relatively thick thickness are formed at opposite sides of the superconducting gate electrode, electrically isolated from the gate electrode.

In a preferred embodiment, the oxide superconductor is formed of high-$T_c$ (high critical temperature) oxide superconductor, particularly, formed of a high-$T_c$ copper-oxide type compound oxide superconductor for example a Y—Ba—Cu—O type compound oxide superconductor material, a Bi—Sr—Ca—Cu—O type compound oxide superconductor material, and a Tl—Ba—Ca—Cu—O type compound oxide superconductor material.

In addition, the substrate can be formed of an insulating substrate, preferably an oxide single crystalline substrate such as MgO, $SrTiO_3$, $CdNdAlO_4$, etc. These substrate materials are very effective in forming or growing a crystalline film having a high orientation property. However, the superconducting device can be formed on a semiconductor substrate if an appropriate buffer layer is deposited thereon. For example, the buffer layer on the semiconductor substrate can be formed of a double-layer coating formed of a $MgAlO_4$ layer and a $BaTiO_3$ layer if silicon is used as a substrate.

Preferably, the superconducting channel is formed of a c-axis orientated oxide superconductor thin film and the superconducting source electrode and the superconducting drain electrode is formed of a-axis orientated oxide superconductor thin films.

In a preferred embodiment, the superconducting channel, the gate insulator and the superconducting gate electrode are formed of the same oxide thin film of which oxygen amount is locally decreased and said gate insulator being formed of a compound oxide which is composed of the same constituent elements as those of the oxide superconductor of which the superconducting channel and the superconducting gate electrode are formed but includes the oxygen amount less than that of said oxide superconductor.

In this preferred embodiment, the superconducting channel and the superconducting gate electrode are formed of a c-axis orientated oxide superconductor thin film.

In another preferred embodiment, the superconducting gate electrode are formed of a a-axis orientated oxide superconductor thin film.

In the superconducting device manufactured in accordance with the present invention, the superconducting current flowing between the superconducting source electrode and the superconducting drain electrode through the superconducting channel is controlled by a voltage applied to the superconducting gate electrode. Namely, the superconducting device constitutes the super-FET. In order to ensure that the superconducting channel can be turned on and off by a voltage applied to the superconducting gate electrode, the superconducting channel has to be made extremely thin, on the order of 5 nanometers in the direction of an electric field created by the voltage applied to the superconducting gate electrode. This extremely thin superconducting channel can be easily realized or formed and the superconducting gate electrode, the gate insulator and the superconducting channel are arranged in a self alignment in accordance with the method of the present invention.

In a preferred embodiment, a first oxide superconductor thin film is formed to have the thickness on the order of about 300 nanometers. The first oxide superconductor thin film is selectively etched by a reactive ion etching process or an ion milling using Ar-ions, so that a portion of the oxide superconductor thin film projects and the portion becomes a superconducting gate electrode. Forming an insulating member which covers the side surface of the superconducting gate electrode, the first oxide superconductor thin film excluding the superconducting gate electrode is further etched so that a superconducting channel having a thickness of less than 5 nanometers is formed under the superconducting gate electrode. Simultaneously, a step portion having a thickness of not less than 10 nanometers, which will be a gate insulator when the super-FET will be completed, is formed on a surface of the superconducting channel and under the superconducting gate electrode. To convert the step portion into the oxide insulating layer, the substrate is heated under high vacuum.

Oxygen of crystals of an oxide superconductor escapes when the oxide superconductor is heated under vacuum. Superconducting properties of an oxide superconductor is sensitive to amounts of oxygen which is included in the crystals of the oxide superconductor. If the crystals of the oxide superconductor lack oxygen, the critical temperature of the oxide superconductor lowers considerably or the oxide superconductor loses its superconductivity.

Therefore, the step portion is converted into an oxide insulating layer, under which the extremely thin oxide superconductor thin film can be formed. The thickness of the oxide insulating layer is controlled by the heat process time. It is preferable to etch the oxide superconductor film so that side surfaces of a portion which will be converted into the oxide insulating layer, which are parallel to the c-axes of crystals of oxide superconductor, are exposed, since the oxygen of crystals of oxide superconductor migrates to a direction perpendicular to the c-axis of crystals of oxide superconductor easier than directions parallel to the a-axes and b-axes of crystals of oxide superconductor.

In another preferred embodiment, a first oxide superconductor thin film is formed to have the thickness on the order of about 20 nanometers and an a-axis orientated oxide superconductor thin film is formed on the first oxide superconductor thin film to have the thickness on the order of about 200 nanometers. A surface protector is deposited on the a-axis orientated oxide superconductor thin film at a position of a superconducting gate electrode to be formed in future. An exposed portion of the a-axis orientated oxide superconductor thin film and a portion of the first oxide superconductor thin film under the a exposed portion of the a-axis orientated oxide superconductor thin film are etched by means of an anisotropic etching so as to form a superconducting gate electrode, a step portion and a superconducting channel. For this purpose, the a-axis orientated oxide superconductor thin film is selectively etched so as to remove all of the a-axis orientated oxide superconductor thin film excluding a portion which becomes the superconducting gate electrode on the superconducting channel, so that the superconducting gate electrode is formed. Then, the first oxide superconductor thin film is selectively etched in a self alignment to the patterned superconducting gate electrode, so that a step portion is left on the superconducting channel and only under the patterned superconducting gate electrode. Thereafter, a heat-treatment mentioned above is carried out. In this embodiment, the upper surface of the superconducting gate electrode formed of a a-axis orientated oxide superconductor thin film is are covered with the surface protector, completely. Therefore, little oxygen of the superconducting gate electrode escapes during the heat-treatment, so that the superconductivity of the superconducting gate electrode is maintained.

The extremely thin oxide superconductor film thus formed is very preferable in thickness and the crystal orientation to form a superconducting channel. In addition, according to the present invention, the superconducting gate electrode, the gate insulator and the superconducting channel are arranged in a self alignment.

As seen from the above, the method in accordance with the present invention includes no process which requires high-precision for forming the superconducting channel. Therefore, the limitation in the fine processing techniques required for manufacturing the super-FET can be relaxed.

The above and other objects, features and advantages of the present invention will be apparent from the following description of preferred embodiments of the invention with reference to the accompanying drawings.

BRIEF DESCRIPTION OF THE DRAWINGS

FIGS. 2A to 2H are diagrammatic sectional views for illustrating a second embodiment of the process in accordance with the present invention for manufacturing the super-FET.

DESCRIPTION OF THE PREFERRED EMBODIMENTS

Referring to FIGS. 1A to 1I, the process in accordance with the present invention for manufacturing the super-FET will be described.

Figure 1A:
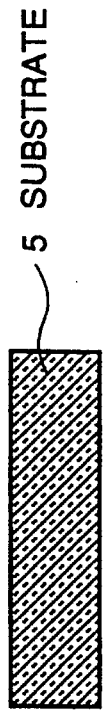
FIGS. 1A to 1I are diagrammatic sectional views for illustrating a first embodiment of the process in accordance with the present invention for manufacturing the super-FET.

As shown in FIG. 1A, a substrate 5 having a substantially planer principal surface is prepared. This substrate 5 is formed of for example, an insulator substrate such as a MgO (100) substrate, a SrTiO$_3$ (100) substrate, a CdNdAlO$_4$ (001) substrate or others, or a semiconductor substrate such as a silicon substrate having a principal surface coated with a buffer layer composed of an insulating film. In the case of the silicon substrate, the principal surface of the silicon is preferably coated with MgAlO$_4$ by a CVD (chemical vapor deposition) and also with BaTiO$_3$ by a sequential sputtering process.

Figure 1B:
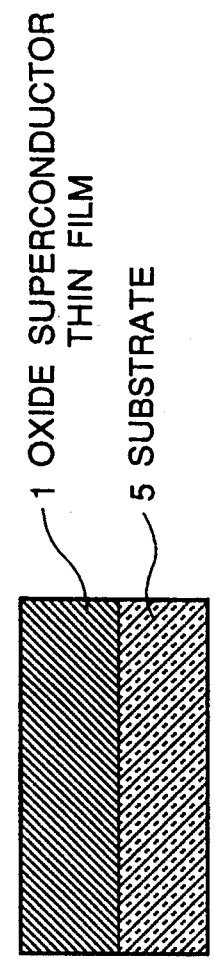

As shown in FIG. 1B, a c-axis orientated Y$_1$Ba$_2$Cu$_3$O$_{7-\delta}$ oxide superconductor thin film 1 having a thickness on the order of about 300 nanometers is deposited on the principal surface of the substrate 5, by for example an off-axis sputtering, a reactive evaporation, an MBE (molecular beam epitaxy), a CVD, etc. A lower portion of this oxide superconductor thin film 1 forms a superconducting channel 10 when the super-FET is completed. The superconducting channel is preferably formed of c-axis orientated thin film, since the c-axis orientated thin film has a large critical current density in the direction in parallel to the substrate surface. A condition of forming the c-axis orientated Y$_1$Ba$_2$Cu$_3$O$_{7-\delta}$ oxide superconductor thin film 1 by off-axis sputtering is as follows:

Sputtering Gas:
  Ar: 90%
  O$_2$: 10%
Pressure: 10 Pa
Temperature of the substrate: 700° C.

The oxide superconductor thin film is preferably formed of a high-T$_c$ (high critical temperature) oxide superconductor material, particularly a high-T$_c$ copper-oxide type compound oxide superconductor material, for example, a Bi—Sr—Ca—Cu—O type compound oxide superconductor material, or a Tl—Ba—Ca—Cu—O type compound oxide superconductor material other than Y—Ba—Cu—O type compound oxide superconductor material.

Figure 1C:
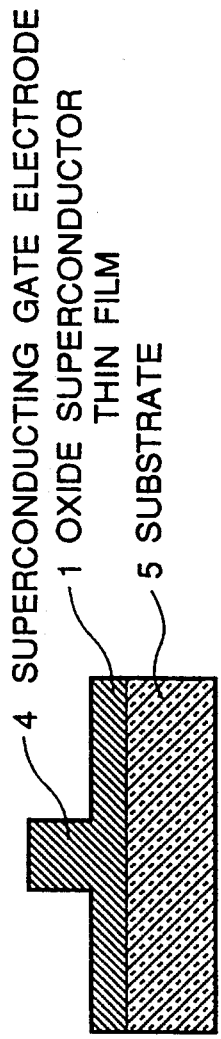

Then, as shown in FIG. 1C, the oxide superconductor thin film 1 is etched by means of an anisotropic etching so as to form a superconducting gate electrode 4. For this purpose, the oxide superconductor thin film 1 is selectively etched by a reactive ion etching process or an ion milling using Ar-ions, so that the oxide superconductor thin film 1 excluding a portion which will be a superconducting gate electrode has a thickness of on the order of 20 nanometers.

Figure 1D:
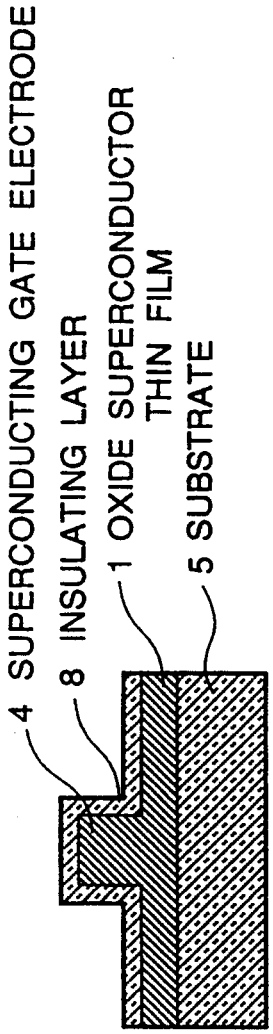
Figure 1E:
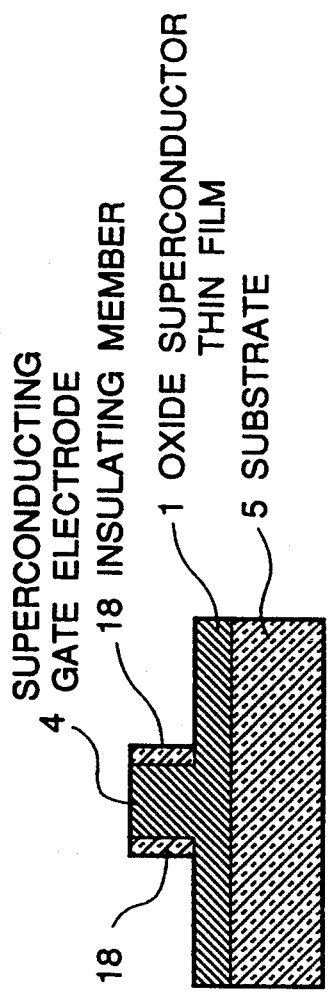

Thereafter, as shown in FIG. 1D, a insulating layer 8 formed of for example MgO is deposited on the oxide superconductor thin film 1 and the superconducting gate electrode 4. The insulating layer 8 is etched by means of an anisotropic etching so as to form insulating members 18 which surround the superconducting gate electrode 4, as shown in FIG. 1E. This etching process is also carried out by a reactive ion etching process or an ion milling using Ar-ions.

Figure 1F:
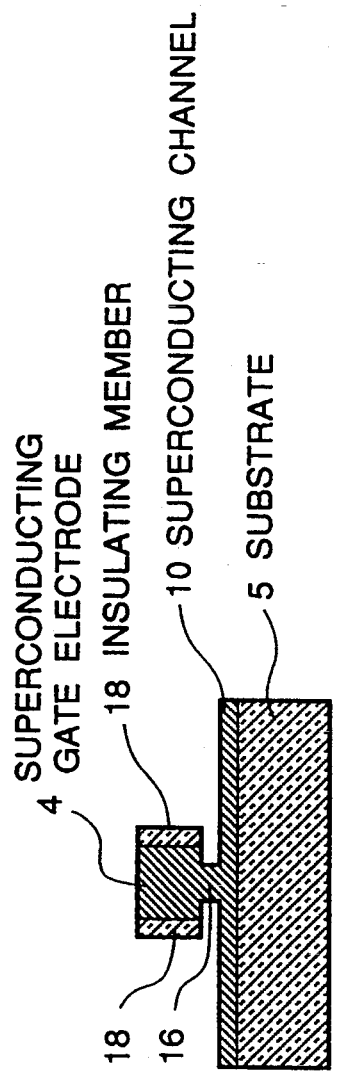

Then, as shown in FIG. 1F, the oxide superconductor thin film 1 excluding the superconducting gate electrode 4 is etched by means of an isotropic etching so that a superconducting channel 10 is formed under the superconducting gate electrode 4 and a step portion 16 is formed on a surface of the superconducting channel 10 and under the superconducting gate electrode 4. The step portion 16 will be a gate insulator, when the super-FET will be completed. The step portion 16 is formed having a thickness of not less than 10 nanometers and the superconducting channel 10 is formed having a thickness of less than 5 nanometers by a reactive ion etching process or an ion milling using Ar-ions. In this connection, it is desired that the step portion 16 is side-etched in comparison with the superconducting gate electrode 4, so that the step portion 16 has a length shorter than that of the superconducting gate electrode 4.

It is desired that the condition of the oxide superconductor thin film 1 is monitored, while the oxide superconductor thin film 1 is etched to form the superconducting channel 10, so as to prevent the superconducting channel 10 from containing a degraded portion of the oxide superconductor thin film 1.

Figure 1G:
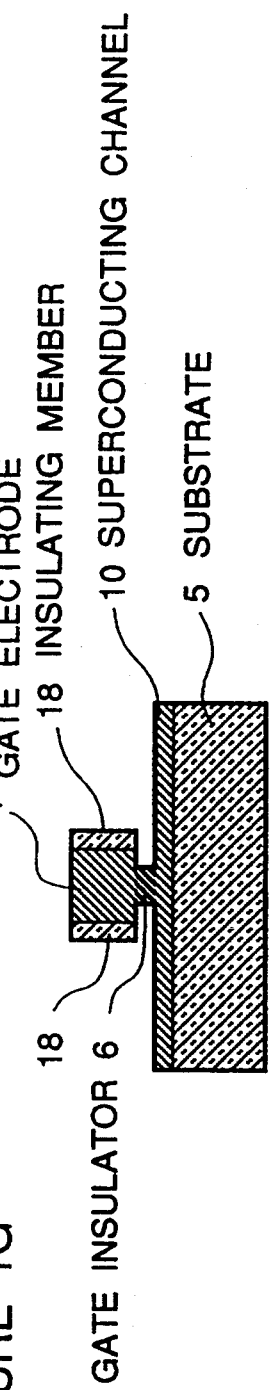

Thereafter, the substrate 5 is heated to more than 400° C. under a pressure of $1 \times 10^{-5}$ Pa. Then, as shown in FIG. 1G, oxygen of the crystals of the oxide superconductor of the step portion 16 escapes through side surfaces so that the step portion 16 changes to the gate insulator 6 and the portion of the superconducting channel 10 under the gate insulator 6 have a thickness of less than 5 nanometers. In this process the oxygen of the crystals of the oxide superconductor of the step portion escapes only through side surfaces, since the oxide superconductor has larger diffusion coefficients of oxygen along the a-axis and the b-axis of the crystal than along the c-axis.

Figure 1H:
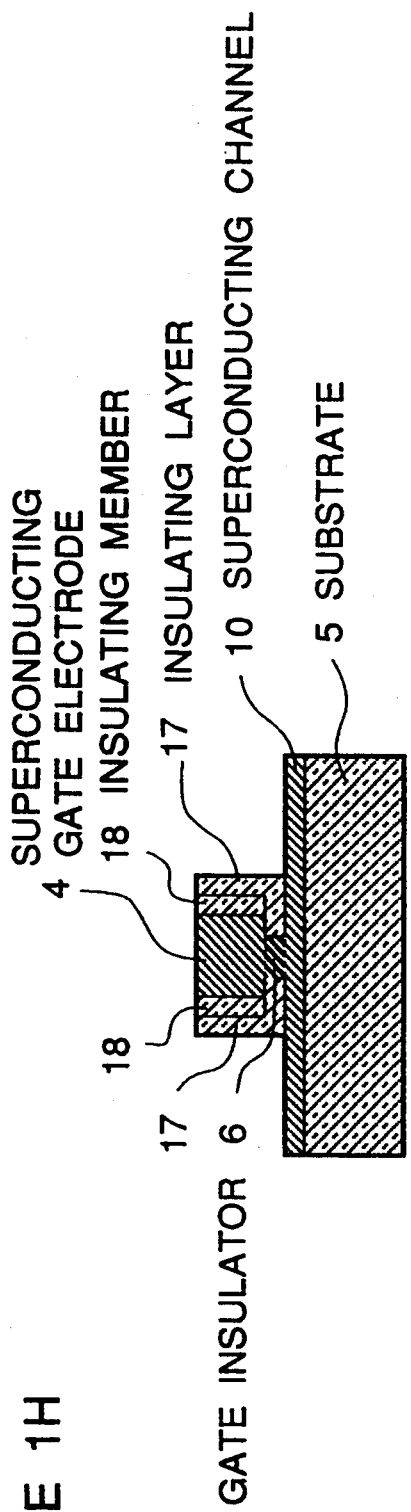

Then, as shown in FIG. 1H, an insulating layer 17 which surrounds the insulating members 18 and the gate insulator 6 is formed of an oxygen barrier material such as a silicon nitride by a sputtering process etc. A cavity may be created beside the gate insulator 6. The insulating layer 17 and the insulating members 18 are integrated into an insulating layer 7.

Figure 1I:
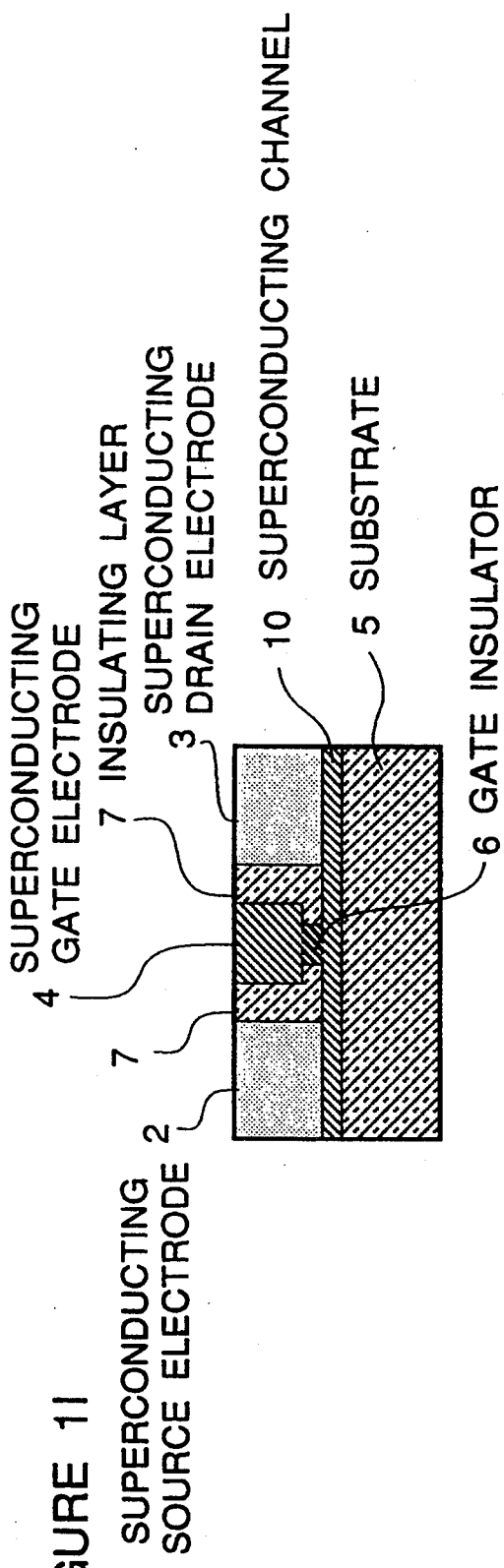

Finally, as shown in FIG. 1I, a superconducting source electrode 2 and a superconducting drain electrode 3 of an a-axis orientated $Y_1Ba_2Cu_3O_{7-\delta}$ oxide superconductor thin film are formed on the superconducting channel 10 at both sides of the superconducting gate electrode 4 and of gate insulator 6, respectively. An a-axis orientated $Y_1Ba_2Cu_3O_{7-\delta}$ oxide superconductor thin film can be formed by an off-axis sputtering process which is carried out under a condition that the substrate temperature is not higher than 650° C. A sputtering condition under which the superconducting source electrode 2 and the superconducting drain electrode 3 are formed is as follows:

Sputtering Gas:
  Ar: 90%
  O2: 10%
Pressure: 10 Pa
Temperature of the substrate: 640° C.

In the process, in order to planarize an upper surface of the deposited a-axis orientated oxide superconductor thin film and to shape the superconducting source electrode 2 and the superconducting drain electrode 3, a photoresist layer (not shown) is deposited on the a-axis orientated oxide superconductor thin film in such a manner that the deposited photoresist layer has a flat upper surface, and then, the deposited photoresist layer and the deposited a-axis orientated oxide superconductor thin film are etched back, until the upper surface of the a-axis orientated oxide superconductor thin film is planarized and the superconducting gate electrode 4 is exposed at the planarized upper surface of the a-axis orientated oxide superconductor thin film as shown in FIG. 1I. A metal source electrode and a metal drain electrode may be formed on the superconducting source electrode 2 and the superconducting drain electrode 3 respectively, if necessary. With this, the super-FET in accordance with the present invention is completed.

As explained above, if the super-FET is manufactured in accordance with the first embodiment of the method of the present invention, the limitation in the fine processing technique required for manufacturing the super-FET is relaxed. Since the flatness of the upper surface of the superconducting device can be improved, it become easy to form conductor wirings in a later process. Further more, since the gate insulator is formed of an oxide which is made of the same composition and has same crystal structure as those of the oxide superconductor constituting the superconducting gate electrode and the superconducting channel, the super-FET is superior in mechanical stability and interfaces between the gate insulator and the superconducting gate electrode, and between the gate insulator and the superconducting channel are formed sharp. Accordingly, it is easy to manufacture the super-FET with good repeatability, and the manufactured super-FET has a stable performance.

Referring to FIGS. 2A to 2H, a second embodiment of the process for manufacturing the superconducting device will be described.

As shown in FIG. 2A, there is prepared a substrate 5, similar to the substrate 5 shown in FIG. 1A.

As shown in FIG. 2B, a c-axis orientated $Y_1Ba_2Cu_3O_{7-\delta}$ oxide superconductor thin film 1 having a thickness on the order of about 20 nanometers is deposited on the principal surface of the substrate 5, by for example an off-axis sputtering. The off-axis sputtering is performed under the same condition as that of the first embodiment. A lower portion of this oxide superconductor thin film 1 forms a superconducting channel 10 when the super-FET is completed.

As shown in FIG. 2C, an a-axis orientated $Y_1Ba_2Cu_3O_{7-\delta}$ oxide superconductor thin film 11 having a thickness on the order of about 200 nanometers is deposited on the c-axis orientated $Y_1Ba_2Cu_3O_{7-\delta}$ oxide superconductor thin film 1. The oxide superconductor thin film 11 will be shaped into a superconducting gate electrode. The off-axis sputtering is performed under the same condition under which the superconducting source electrode 2 and the superconducting drain electrode 3 are formed in the first embodiment.

Figure 2D:
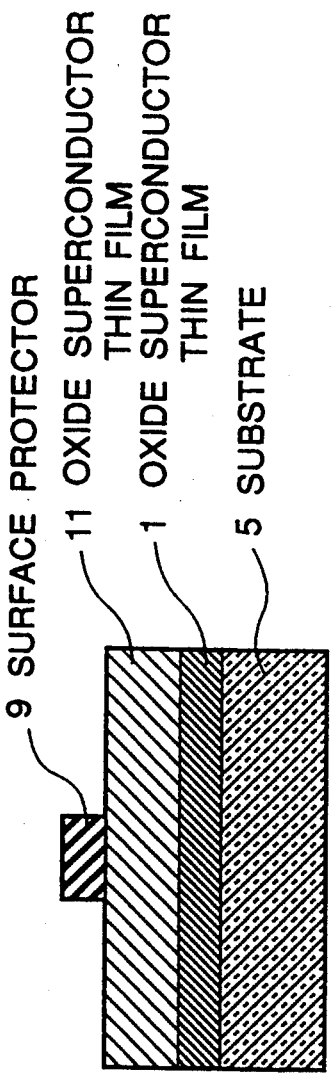

Then, as shown in FIG. 2D, a surface protector 9 is deposited on the oxide superconductor thin film 11 at a position of a superconducting gate electrode to be formed in future. Preferably, the surface protector 9 is formed of a metal such as Au, or an insulating material and it is desired that the surface protector 9 is constituted by stacked layers including a metal layer or a insulator layer and photo resist film, if necessary.

Figure 2E:
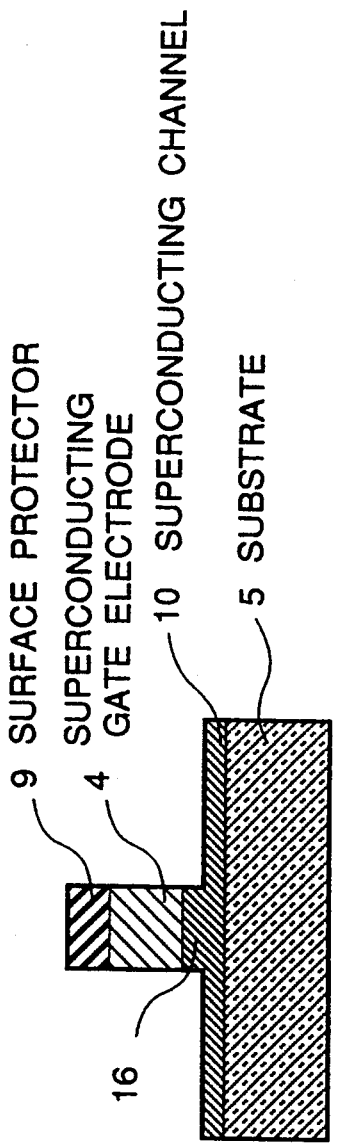

Thereafter, an exposed portion of the oxide superconductor thin film 11 and a portion of the oxide superconductor thin film 1 under the a exposed portion of the oxide superconductor thin film 11 are etched by means of an anisotropic etching so as to form a superconducting gate electrode 4, a step portion 16 and a superconducting channel 10, as shown in FIG. 2E. For this purpose, the oxide superconductor thin film 11 is selectively etched by a reactive ion etching process or an ion milling using Ar-ions so as to remove all of the oxide superconductor thin film 11 excluding a portion which becomes the superconducting gate electrode on the superconducting channel 10, so that the superconducting gate electrode 4 is formed. Then, the oxide superconductor thin film 1 is selectively etched in a self alignment to the patterned superconducting gate electrode 4, so that a step portion 16 is left on the superconducting channel 10 and only under the patterned superconducting gate electrode 4. The step portion 16 will be a gate insulator, when the super-FET will be completed. The step portion 16 is formed having a thickness of not less than 10 nanometers and the superconducting channel 10 is formed having a thickness of less than 5 nanometers. In this connection, it is desired that the step portion 16 is side-etched in comparison with the superconducting gate electrode 4, so that the step portion 16 has a length shorter than that of the superconducting gate electrode 4, if necessary.

It is desired that the condition of the oxide superconductor thin film 1 is monitored, while the oxide superconductor thin film 1 is etched to form the superconducting channel 10, so as to prevent the superconducting channel 10 from containing a degraded portion of the oxide superconductor thin film 1.

Figure 2F:
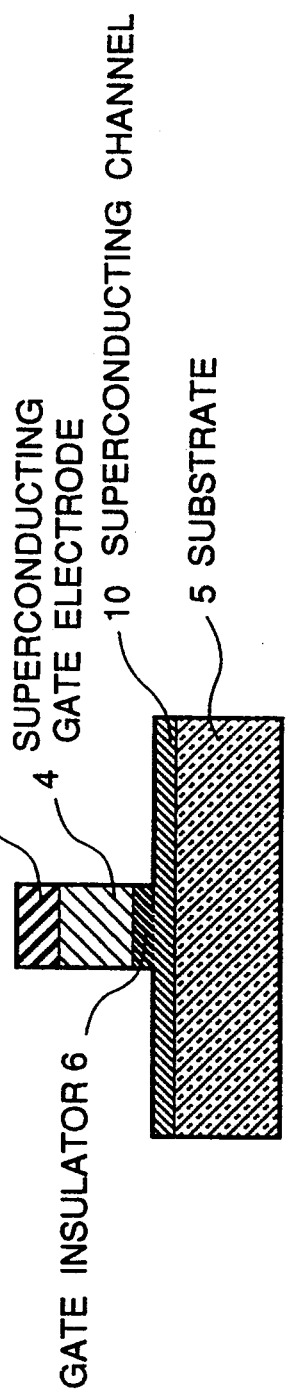

Thereafter, the substrate 5 is heated to more than 400° C. under a pressure of $10^{-5}$ Pa. Then, as shown in FIG. 2F, oxygen of the crystals of the oxide superconductor of the step portion 16 escapes through side surfaces so that the step portion 16 changes to the gate insulator 6 and the portion of the superconducting channel 10 under the gate insulator 6 have a thickness of less than 5 nanometers. In this process the oxygen of the crystals of the oxide superconductor of the step portion escapes only through side surfaces, since the oxide superconductor has larger diffusion coefficients of oxygen along the a-axis and the b-axis of the crystal than along the c-axis. Particularly, since the superconducting gate electrode 4 is formed of an a-axis orientated oxide superconductor thin film and the surface protector is formed on the upper surface of the superconducting gate electrode 4, little oxygen escapes from the superconducting gate electrode 4.

Figure 2G:
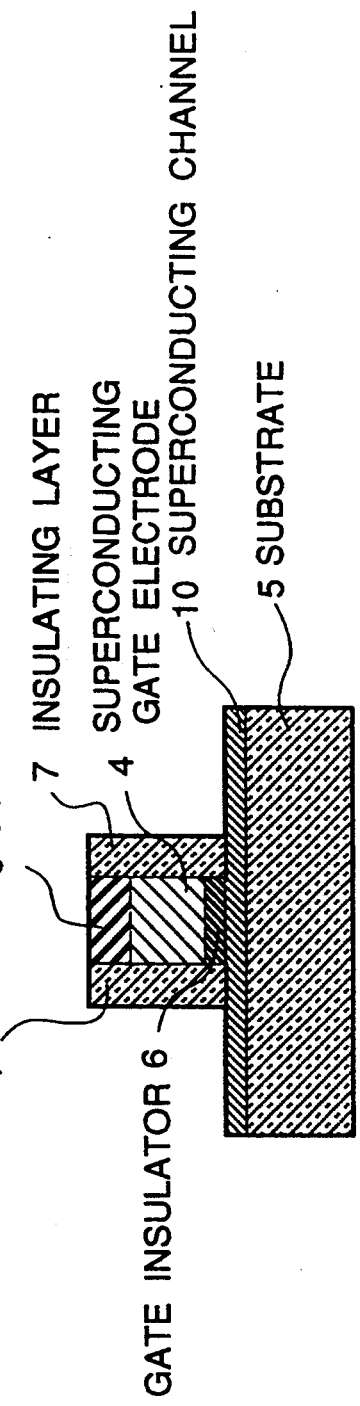

Thereafter, as shown in FIG. 2G, a insulating layer 7 which surrounds the surface protector 9, the superconducting gate electrode 4 and the gate insulator 6 is formed of an oxygen barrier material such as a silicon nitride.

Figure 2H:
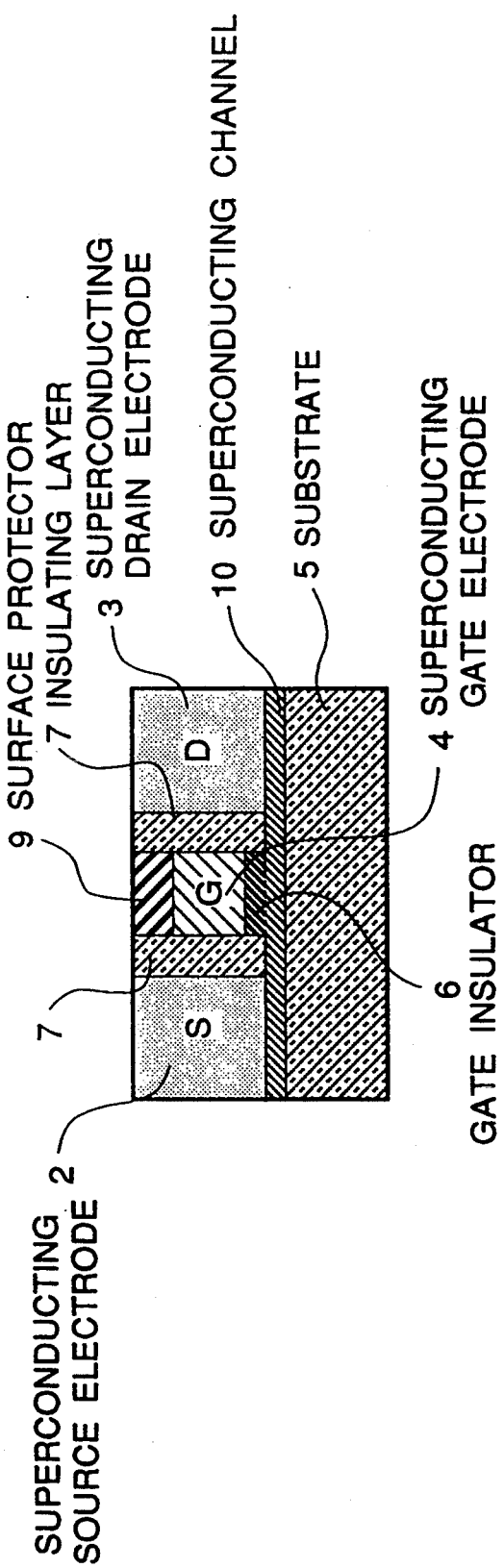

Finally, as shown in FIG. 2H, a superconducting source electrode 2 and a superconducting drain electrode 3 of an a-axis orientated $Y_1Ba_2Cu_3O_{7-\delta}$ oxide superconductor thin film are formed on the superconducting channel 10 at both sides of the superconducting gate electrode 4 and of gate insulator 6, respectively by for example an off-axis sputtering. The off-axis sputtering is performed under the same condition as that of the first embodiment. A metal source electrode and a metal drain electrode may be formed on the superconducting source electrode 2 and the superconducting drain electrode 3 respectively, if necessary.

As explained above, if the above mentioned super-FET is manufactured in accordance with the above mentioned process, the limitation in the fine processing technique required for manufacturing the super-FET is relaxed. In addition, since the substantially planarized upper surface is obtained, it become easy to form conductor wirings in a later process. Further more, since the gate insulator is formed of an oxide which is made of the same composition and has same crystal structure as those of the oxide superconductor constituting the superconducting gate electrode and the superconducting channel, the super-FET is superior in mechanical stability and interfaces between the gate insulator and the superconducting gate electrode, and between the gate insulator and the superconducting channel are formed sharp. Accordingly, it is easy to manufacture the super-FET with good repeatability, and the manufactured super-FET has a stable performance.

In the above mentioned embodiments, the oxide superconductor thin film can be formed of not only the Y—Ba—Cu—O type compound oxide superconductor material, but also a high-$T_c$ (high critical temperature) oxide superconductor material, particularly a high-$T_c$ copper-oxide type compound oxide superconductor material, for example a Bi—Sr—Ca—Cu—O type compound oxide superconductor material, and a Tl—Ba—Ca—Cu—O type compound oxide superconductor material.

The invention has thus been shown and described with reference to the specific embodiments. However, it should be noted that the present invention is in no way limited to the details of the illustrated structures but converts and modifications may be made within the scope of the appended claims.

We claim:

1. A superconducting device comprising
   a substrate,
   a superconductor channel of a c-axis oriented oxide superconductor thin film on the principal surface of the substrate, the channel having a thickness in a direction perpendicular to the principal surface,
   a superconducting source electrode and a superconducting drain electrode of an a-axis oriented oxide superconductor thin film, the a-axis oriented oxide superconductor thin film being on the superconducting channel at separated locations and being electrically connected by the superconducting channel, so that a superconducting current can flow through the superconducting channel between the superconducting source electrode and the superconducting drain electrode, the source and drain electrodes having thicknesses greater than the thickness of the channel in said direction,
   a superconducting gate electrode, formed of oxide superconductor through a gate insulator on the superconducting channel, for controlling superconducting current flowing through the superconducting channel, and
   a side insulating region formed to completely cover each of opposite side surfaces of the superconducting gate electrode, wherein
   the thickness of the superconducting channel is such that a complete ON/OFF operation is attained when a signal voltage is applied to the superconducting gate electrode,
   the c-axis oriented oxide superconductor thin film has a lower portion which provides the superconducting channel and an upper portion which provides the gate insulator, the upper portion which provides the gate insulator having oxygen therein in an amount less than that of the lower portion which provides the superconducting channel, and the superconducting gate electrode is surrounded by the superconducting channel, the superconducting source electrode and the superconducting drain electrode while being electrically isolated from the superconducting channel, the superconducting source electrode and the superconducting drain electrode by the gate insulator and the side insulating region.

2. A superconducting device claimed in claim 1 wherein the superconducting channel, the superconducting source electrode, the superconducting drain electrode and the superconducting gate electrode are formed of high-$T_c$ (high critical temperature) oxide superconductor, particularly, formed of a high-$T_c$ copper-oxide type compound oxide superconductor.

3. A superconducting device claimed in claim 2 wherein the superconducting channel, the superconducting source electrode, the superconducting drain electrode and the superconducting gate electrode are formed of oxide superconductor material selected from the group consisting of a Y—Ba—Cu—O type compound oxide superconductor material, a Bi—Sr—Ca—Cu—O type compound oxide superconductor material, and a Tl—Ba—Ca—Cu—O type compound oxide superconductor material.

4. A superconducting device claimed in claim 1 wherein the superconducting device further includes a surface protector formed on an upper surface of the superconducting gate electrode, which covers the upper surface of the superconducting gate electrode completely.

5. A superconducting device claimed in claim 4 wherein the surface protector is formed of a metal material or an insulating material.

6. A superconducting device claimed in claim 4 wherein the surface protector is formed of a stacked structure including a photo resist layer and a metal layer, or a photo resist layer and an insulating layer.

7. A superconducting device claimed in claim 1 wherein the upper portion of the c-axis oriented superconductor thin film has a first upper portion and a second upper portion, the first upper portion being located on the second upper portion and providing the superconducting gate electrode, the second upper portion providing the gate insulator.

8. A superconducting device claimed in claim 1 wherein the superconducting gate electrode is formed of an a-axis orientated oxide superconductor thin film.

9. A superconducting device claimed in claim 1 wherein the side insulating region includes an oxygen barrier layer.

10. A superconducting device claimed in claim 9 wherein the oxygen barrier layer is formed of silicon nitride.

11. A superconducting device claimed in claim 9 wherein the side insulating region further includes another insulator layer.

12. A superconducting device claimed in claim 11 wherein the another insulator layer is formed of MgO.

13. A superconducting device claimed in claim 1 wherein the substrate is formed of a material selected from the group consisting of a MgO (100) substrate, a $SrTiO_3$ (100) substrate and a $CdNdeAlO_4$ (001) substrate, and a semiconductor substrate.

14. A superconducting device claimed in claim 1 wherein the substrate is formed of a silicon substrate and a principal surface of the silicon substrate is coated with an insulating material layer which is formed of a $MgAlO_4$ layer and a $BaTiO_3$ layer.

* * * * *